(12) United States Patent
Brandorff

(10) Patent No.: US 9,267,968 B2
(45) Date of Patent: Feb. 23, 2016

(54) PROBE CARD ASSEMBLIES AND PROBE PINS INCLUDING CARBON NANOTUBES

(75) Inventor: Alexander Brandorff, New Milford, CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 289 days.

(21) Appl. No.: 13/992,315

(22) PCT Filed: Dec. 9, 2011

(86) PCT No.: PCT/US2011/064065
§ 371 (c)(1),
(2), (4) Date: Oct. 17, 2013

(87) PCT Pub. No.: WO2012/078944
PCT Pub. Date: Jun. 14, 2012

(65) Prior Publication Data
US 2014/0028342 A1    Jan. 30, 2014

Related U.S. Application Data

(60) Provisional application No. 61/421,409, filed on Dec. 9, 2010.

(51) Int. Cl.
*G01R 1/073* (2006.01)
*G01R 31/28* (2006.01)
*G01R 1/067* (2006.01)

(52) U.S. Cl.
CPC ........ *G01R 1/07342* (2013.01); *G01R 31/2886* (2013.01); *G01R 1/06733* (2013.01)

(58) Field of Classification Search
USPC ............. 324/754.01, 754.03, 754.07, 755.03, 324/750.3, 762.01–762.05, 757.02, 757.03, 324/757.04, 763.01, 756.03, 755.01
See application file for complete search history.

(56) References Cited

U.S. PATENT DOCUMENTS 5,546,405 A      8/1996  Golla
6,130,546 A  * 10/2000  Azizi ...................... 324/755.04
(Continued)

FOREIGN PATENT DOCUMENTS

DE    102007050843 A1   5/2008
JP         10260233       9/1998
(Continued)

OTHER PUBLICATIONS

Notification of the First Office Action in Chinese Patent Application No. 201180065274.3. The State Intellectual Property Office, Oct. 20, 2014.

(Continued)

*Primary Examiner* — Jermele M Hollington
*Assistant Examiner* — Douglas X Rodriguez
(74) *Attorney, Agent, or Firm* — Wiggin and Dana LLP; Anthony P. Gangemi

(57) ABSTRACT

A probe card assembly for testing circuit boards is disclosed. In some embodiments, the assembly includes the following: a multi-layered dielectric plate aligned with an integrated circuit, the integrated circuit having on its surface a first plurality of electrical contacts arranged in a pattern, the dielectric plate having arrayed upon its surface a second plurality of electrical contacts arranged in a pattern substantially matching the first plurality of electrical contacts; a nanotube interposer interposed between the dielectric plate and the integrated circuit, the nanotube interposer having compliant carbon nanotubes that are arranged to match the pattern of electrical contacts on the integrated circuit and the dielectric plate; and a plurality of vertical probes arrayed upon the nanotube interposer and joined with the nanotubes, the vertical probes making electrical contact with the first plurality of electrical contacts and the second plurality of electrical contacts via the nanotubes.

14 Claims, 2 Drawing Sheets

(56) References Cited

U.S. PATENT DOCUMENTS

| | | | |
|---|---|---|---|
| 6,211,690 B1 * | 4/2001 | Fjelstad | 324/754.18 |
| 6,849,554 B2 | 2/2005 | Rattner et al. | |
| 6,906,539 B2 | 6/2005 | Wilson et al. | |
| 2002/0008529 A1 | 1/2002 | Wilson et al. | |
| 2002/0109514 A1 | 8/2002 | Brandorff et al. | |
| 2003/0211029 A1 | 11/2003 | Someya et al. | |
| 2004/0106218 A1 | 6/2004 | Wang et al. | |
| 2004/0211589 A1 | 10/2004 | Chou et al. | |
| 2007/0267735 A1 | 11/2007 | Awano et al. | |
| 2009/0002004 A1 | 1/2009 | Wang et al. | |
| 2009/0002009 A1 | 1/2009 | Brandorff | |
| 2009/0066352 A1 * | 3/2009 | Gritters et al. | 324/755 |
| 2009/0121732 A1 | 5/2009 | Crafts et al. | |
| 2010/0083489 A1 | 4/2010 | Eldridge et al. | |
| 2010/0252317 A1 * | 10/2010 | Gritters et al. | 174/261 |

FOREIGN PATENT DOCUMENTS

| | | |
|---|---|---|
| JP | 2006226702 | 8/2006 |
| JP | 2006273601 | 10/2006 |
| JP | 2007311700 | 11/2007 |
| JP | 2008201594 | 9/2008 |
| TW | I220162 | 8/2004 |
| TW | I220163 | 11/2004 |
| WO | 2008069485 A1 | 6/2008 |
| WO | 2010037097 A1 | 4/2010 |

OTHER PUBLICATIONS

International Search Report and The Written Opinion of the International Searching Authority, International Application No. PCT/US2011/064065, filed Dec. 9, 2011.

Xu, T., et al., "Aligned carbon nanotubes for through-wafer interconnects," Applied Physics Letters, vol. 91, pp. 25-27, 2007.

Maschmann, M.R., et al., "Optimization of carbon nanotube synthesis from porous anodic Al—Fe—Al templates," Elsevier, pp. 2290-2296, 2007.

Japanese Patent Office, "Notice of Reasons for Refusal," Jul. 3, 2013.

The State Intellectual Property Office of P.R. China, "Notification of the First Office Action," May 6, 2013.

International Search Report and The Written Opinion of the International Searching Authority, International Application No. PCT/US2009/058787, Nov. 17, 2009.

Supplementary European Search Report, International Application No. PCT/US2009/058787, Jul. 23, 2012.

Notice to File a Response from Korean Patent Application No. 20-2011-7009741, dated Aug. 25, 2015.

Japanese Patent Office, "Notice of Reasons for Refusal," dated Oct. 26, 2015.

* cited by examiner

PROBE CARD ASSEMBLIES AND PROBE PINS INCLUDING CARBON NANOTUBES

CROSS REFERENCE TO RELATED APPLICATION(S)

This application claims the benefit of U.S. Provisional Application No. 61/421,409, filed Dec. 9, 2010, which is incorporated by reference as if disclosed herein in its entirety.

BACKGROUND

In the computer chip manufacturing industry, it is necessary to test the performance of integrated circuits (IC's) at various points in the manufacturing process, in order to weed out defective components and to monitor the manufacturing process. Various technologies have been employed for this purpose, though all are challenged due to the increasing demands of the IC manufacturing process.

In order to electrically test the circuitry, it is necessary to make contact with pads on the IC, i.e., to "probe" the IC. The probes must be able to align very accurately with the IC pads to be tested, and to provide sufficient current to power the IC as well as provide reliable, low resistance electrical contact at low inductance such that the test signals are not distorted. As IC manufacturing progresses to increasingly smaller geometries, increasing number of transistors, and higher clock frequencies, it challenges the abilities of existing technologies to probe the IC. The smaller geometries result in reduced test pad dimensions, which then require the probes to be better aligned to insure that they do not miss the pads. The increasing number of transistors and higher clock frequencies require that the probes be able to provide an increasing amount of current without burning up or "fusing" the probe, or reducing the probes physical characteristics such as spring force and fatigue life.

IC manufacturers increasingly desire that the IC's be tested at elevated ambient temperature to better simulate worst-case environmental conditions or to perform accelerated life testing. This places an increasing burden on the probe to be able to provide the high current levels at elevated temperatures of 150 degrees Celsius. The increased processing speed of the IC's further requires that the probes have low inductance so as not to distort the clock and signal waveforms that are fed to the IC, and to accurately transfer the waveforms from the IC to the monitoring test equipment.

Some designs in the art include assemblies that combine known conventional vertical buckling beam (VBB) sort interface unit assemblies where the probe head includes an array of curved probes. In such designs, one end of the probes (the "tips") makes contact with the wafer being tested and the other end (the "head") makes contact with the array of contact pads on the "C4" side of the space transformer. The curved shape of the wires allows them to flex and act as springs when making contact with the wafer. The compression of the wires allows them to compensate for wafer height and planarity variations without damaging the wafer pads. The requirement that the probes be flexible complicates the manufacturing of the probes and the assembly of the probe head. It also requires that the wires be relatively long (about ¼") in order to limit the mechanical stress in the wire as it flexes.

There are many known testing devices that do not include the use of carbon nanotubes. For example, U.S. Pat. Nos. 6,906,540, 6,756,797, and 6,297,657, each of which is incorporated by reference as if disclosed herein in its entirety all teach various IC testing devices that do not include the use of carbon nanotube technology. Other assemblies include the use of carbon nanotube bundle probes. Such assemblies can provide unique fabrication challenges and difficult repair challenges.

SUMMARY

One aspect of the disclosed subject matter is a probe card assembly for testing circuit boards. In some embodiments, the assembly includes the following: a multi-layered dielectric plate aligned with an integrated circuit, the integrated circuit having arrayed upon its surface a first plurality of electrical contacts arranged in a pattern, the dielectric plate having arrayed upon its surface a second plurality of electrical contacts arranged in a pattern substantially matching the first plurality of electrical contacts; a carbon nanotube interposer interposed between the dielectric plate and the integrated circuit, the nanotube interposer having compliant nanotubes that are arranged to match the pattern of electrical contacts on the integrated circuit and the dielectric plate; and a plurality of vertical probes arrayed in a pattern upon the nanotube interposer and joined with the carbon nanotubes, the vertical probes making electrical contact with the first plurality of electrical contacts and the second plurality of electrical contacts via the carbon nanotubes.

BRIEF DESCRIPTION OF THE DRAWINGS

For the purpose of illustrating the invention, the drawings show a form of the disclosed subject matter that is presently preferred. However, it should be understood that the disclosed subject matter is not limited to the precise arrangements and instrumentalities shown in the drawings, wherein.

DETAILED DESCRIPTION

The disclosed subject matter includes probe card assemblies that include arrays of carbon nanotubes incorporated in interposers to bridge the gap between a space transformer and a probe head assembly and provide the necessary compliance when testing with straight, substantially rigid probes.

Figure 1:
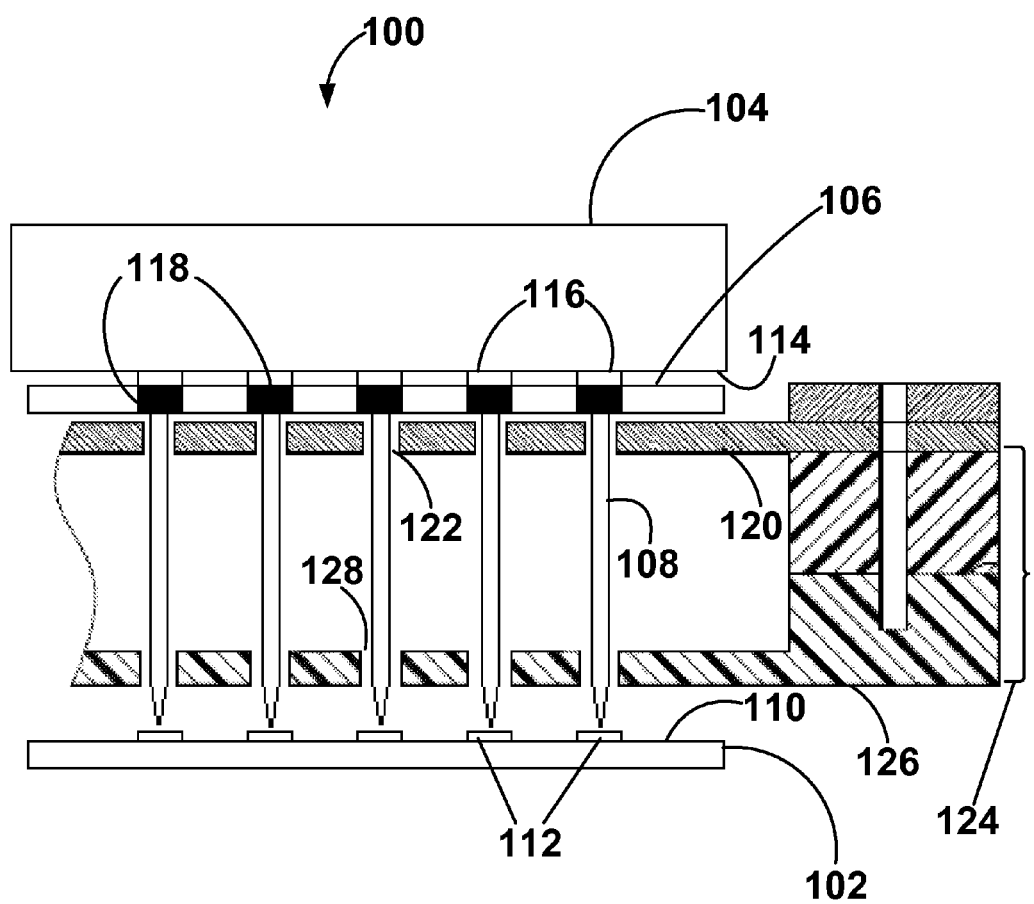
FIG. 1 is a side elevation view of a probe card assembly including a carbon nanotube interposer according to some embodiments of the disclosed subject matter.
Figure 2:
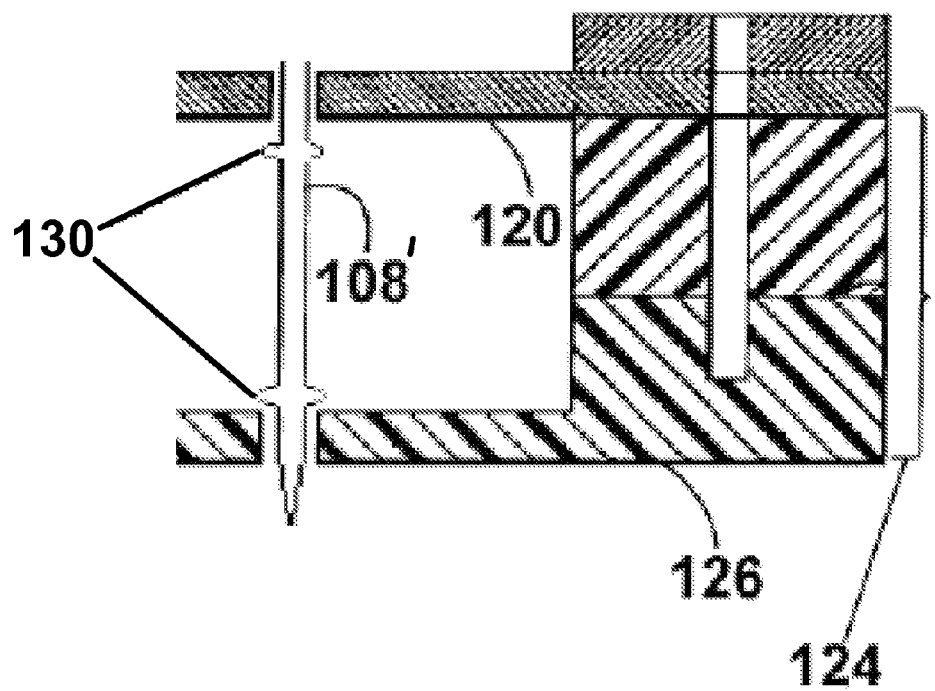
FIG. 2 is side elevation view of a probe card assembly including probes with raised surfaces according to some embodiments of the disclosed subject matter.

Referring now to FIGS. 1 and 2, some embodiments of the disclosed subject matter include a probe card assembly 100 for testing circuit boards 102, which include a multi-layered dielectric plate 104, a carbon nanotube interposer 106, and a plurality of substantially vertical and rigid probes 108.

Multi-layered dielectric plate 104 is aligned with integrated circuits 102. Integrated circuits 102 has arrayed upon a surface 110 a first plurality of electrical contacts 112 arranged in a pattern. Dielectric plate 104 has arrayed upon a surface 114 a second plurality of electrical contacts 116 arranged in a pattern substantially matching first plurality of electrical contacts 112.

Carbon nanotube interposer 106 is interposed between dielectric plate 104 and integrated circuits 102. Carbon nanotube interposer 106 has compliant carbon nanotubes 118 that are arranged to match the pattern of electrical contacts 112, 116 on integrated circuits 102 and dielectric plate 104, respectively. Carbon nanotubes 118 can be formed by laying down "spots" of vertically-aligned multi-walled carbon nanotubes on pre-patterned substrates by chemical vapor deposition. A prepolymer solution is then added and cured.

The material is then peeled away from the substrates to develop a freestanding film material having aligned carbon nanotubes in a transparent polymer matrix.

Plurality of substantially vertical and rigid, i.e., non-compliant, probes 108 are arrayed in a pattern upon nanotube interposer 106 and positioned adjacent or joined with carbon nanotubes 118. Vertical probes 108 make electrical contact with first plurality of electrical contacts 112 and second plurality of electrical contacts 116 via carbon nanotubes 118. Carbon nanotubes 118 serve as the electrical conduit between vertical probes 108 and second plurality of electrical contacts 116. In some embodiments, carbon nanotubes 118 are formed in an array having radial spacing of less than 100 nm. While carbon nanotubes 118 can be custom sized, in some embodiments, each of the carbon nanotubes has a height less than 20 mils and each of the carbon nanotube bundles requires less than 8 grams per mil of compression.

To facilitate fabrication of probe card assembly 100, a conventional assembly aid film 120 including a first array of holes 122 and a die head 124 including a lower die head 126 having a second array of holes 128 can be used to align probes 108 by extending the probes through the first and second arrays of holes.

As best shown in FIG. 2, in some embodiments, probes 108' include one or more raised surfaces 130. One or more raised surfaces 130 on probe 108' releasably secure probe 108' within die head 124.

Inserting nanotube interposer 106 between dielectric plate 104 and integrated circuit 102 allows for a simpler probe and head construction. The individual bundles of nanotubes, i.e., nanotubes 118, compress like springs and provide the necessary compliance. This allows for probes 108 to be straight wire probes, since they no longer have to flex, which greatly simplifies the probe manufacturing process and reduces cost. Straight wires are also much easier to insert into the head, allowing for automated head assembly. Since the wires do not undergo deflection stresses they can be much shorter, which reduces their inductance and allows for higher test frequencies, and also increases their current capacity. It also allows them to be placed closer together to accommodate testing of chips with smaller pads and tighter pad pitches.

Probe 108 can be custom-sized. In some embodiments, carbon nanotube bundles 118 are formed in an array having radial spacing of less than 100 nm, each of the carbon nanotube bundles has a height less than 20 mil, each of the carbon nanotube bundles has stiffness less than 8 grams per mil of compression. In some embodiments, the uniform thickness of each probe shaft 108 is between about 2 mils and about 5 mils.

Assemblies and probes according to the disclosed subject matter offer advantages over known designs. Assemblies according to the disclosed subject matter allow for the use shorter, straight manufactured contacts/probes, which will allow for higher currents and less inductance. Straight probes allow for automated insertion of the probes, which results in faster assembly and shorter lead-times. The use of manufactured probes rather than nanotube bundle probes maintains head reparability.

The use of straight probes increases accuracy and alignment and allows for smaller geometries of contact and interface, which helps reduce shorting. Some embodiments include a less than 0.5 mil radial alignment.

Assemblies according to the disclosed subject matter provide finer pitch solutions. As mentioned above, the nanotubes in the nanotube interposer can be grown to a desired size, e.g., custom width and height, and can have contacts that are 20 mils long or smaller. The nanotubes are compliant, i.e., able to accommodate wafer/bump height variations, allow for larger arrays, have no contact gap, and lower grams per mil, e.g., less than 8 grams total per contact. As a result, the electrical contacts or pads on the multi-layered dielectric plate (or multi-layered ceramic (MLC) do not wear as quickly and no re-plating is required.

Compared to conventional probe card heads, no probe insulation or coating is required. Nanotube interposers can be manufactured quickly at a high volume and a low cost. Nanotube interposers are suitable for fine pitch applications, higher frequency applications, and broader temperature ranges.

Although the disclosed subject matter has been described and illustrated with respect to embodiments thereof, it should be understood by those skilled in the art that features of the disclosed embodiments can be combined, rearranged, etc., to produce additional embodiments within the scope of the invention, and that various other changes, omissions, and additions may be made therein and thereto, without parting from the spirit and scope of the present application.

What is claimed is:

1. A probe card assembly for testing circuit boards comprising:
    a multi-layered dielectric plate aligned with an integrated circuit, said integrated circuit having arrayed upon a surface thereof a first plurality of electrical contacts arranged in a pattern, said dielectric plate having arrayed upon a surface thereof a second plurality of electrical contacts arranged in a pattern substantially matching said first plurality of electrical contacts;
    a carbon nanotube interposer interposed between said dielectric plate and said integrated circuit, said nanotube interposer having compliant carbon nanotubes that are arranged to match the pattern of electrical contacts on said integrated circuit and said dielectric plate; and
    a plurality of substantially non-compliant vertical probes arrayed in a pattern upon said nanotube interposer and joined with said nanotubes, said vertical probes making electrical contact with said first plurality of electrical contacts and said second plurality of electrical contacts via said carbon nanotubes, wherein the probes have a substantially elongated conformation more than said carbon nanotubes.

2. A probe card assembly according to claim 1, wherein each of said carbon nanotubes serves as an electrical conduit between said vertical probes and said second plurality of electrical contacts.

3. A probe card assembly according to claim 1, further comprising:
    an assembly aid film having a first array of holes; and a die head including a second array of holes;
    wherein said probes extend through said first and second arrays of holes.

4. A probe card assembly according to claim 1, wherein said carbon nanotubes are formed in an array having radial spacing of less than 0.5 mil.

5. A probe card assembly according to claim 1, wherein each of said carbon nanotubes has a height and width less than 1 mil.

6. A probe card assembly according to claim 1, wherein each of said carbon nanotubes is less than 8 grams per mil.

7. A probe card assembly according to claim 1, wherein each of said probes includes one or more raised surfaces.

8. A probe card assembly for testing circuit boards comprising:
    a dielectric plate aligned with an integrated circuit, said integrated circuit having arrayed upon a surface thereof a first plurality of electrical contacts arranged in a pattern, said dielectric plate having arrayed upon a surface thereof a second plurality of electrical contacts arranged in a pattern substantially matching said first plurality of electrical contacts;
a carbon nanotube interposer interposed between said dielectric plate and said integrated circuit, said nanotube interposer having compliant carbon nanotubes that are arranged to match the pattern of electrical contacts on said integrated circuit and said dielectric plate; and
a plurality of substantially non-compliant vertical probes arrayed in a pattern upon said nanotube interposer and joined with said nanotubes, said vertical probes making electrical contact with said first plurality of electrical contacts and said second plurality of electrical contacts via said carbon nanotubes;
an assembly aid film having a first array of holes; and
a die head including a second array of holes, wherein said probes extend through said first and second arrays of holes wherein the probes have a substantially elongated conformation more than said carbon nanotubes.

9. A probe card assembly according to claim 8, wherein said dielectric plate is multi-layered.

10. A probe card assembly according to claim 8, wherein each of said carbon nanotubes serves as an electrical conduit between said vertical probes and said second plurality of electrical contacts.

11. A probe card assembly according to claim 8, wherein said carbon nanotubes are formed in an array having radial spacing of less than 0.5 mil.

12. A probe card assembly according to claim 8, wherein each of said carbon nanotubes has a height and width less than 1 mil.

13. A probe card assembly according to claim 8, wherein each of said carbon nanotubes is less than 8 grams per mil.

14. A probe card assembly according to claim 8, wherein each of said probes includes one or more raised surfaces.

\* \* \* \* \*